(12) United States Patent
Chiu et al.

(10) Patent No.: US 9,721,056 B2
(45) Date of Patent: Aug. 1, 2017

(54) METHOD FOR WIRE WIDENING IN CIRCUIT ROUTING SYSTEM

(71) Applicant: Synopsys, Inc., Mountain View, CA (US)

(72) Inventors: Hsien-Shih Chiu, Taipei (TW); Kai-Shun Hu, Taipei (TW)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/576,117

(22) Filed: Dec. 18, 2014

(65) Prior Publication Data

US 2015/0178441 A1   Jun. 25, 2015

Related U.S. Application Data

(60) Provisional application No. 61/918,646, filed on Dec. 19, 2013.

(51) Int. Cl.
*G06F 17/50* (2006.01)

(52) U.S. Cl.
CPC ...... *G06F 17/5081* (2013.01); *G06F 17/5077* (2013.01)

(58) Field of Classification Search
CPC .................................... G06F 17/50
USPC ....................................... 716/111
See application file for complete search history.

(56) References Cited

U.S. PATENT DOCUMENTS

| | | |
|---|---|---|
| 2006/0294488 A1 | 12/2006 | Waller |
| 2009/0193382 A1* | 7/2009 | Melzner ............. G06F 17/5072 716/129 |
| 2010/0211718 A1 | 8/2010 | Gratz et al. |
| 2015/0278421 A1 | 10/2015 | Chiu et al. |

OTHER PUBLICATIONS

U.S. Appl. No. 14/576,108, Non-Final Office Action mailed Aug. 31, 2016.
U.S. Appl. No. 14/576,108, Requirement for Restriction/Election mailed Jan. 21, 2016.

\* cited by examiner

*Primary Examiner* — Thuan Do
(74) *Attorney, Agent, or Firm* — Alston & Bird LLP

(57) ABSTRACT

A method for designing an integrated circuit (IC) includes, in part, dividing the wires disposed in the IC into a multitude of segments each having a length extending from a first end point to a second end point. Each segment is then widened without overlapping any adjacent object. As an example, an intermediate, or expanded, segment is formed that includes the first and the second end points and has a size to overlap with an adjacent object. The method includes identifying regions in the adjacent objects that overlap with the expanded segment. For each of the identified regions, an expanded region is formed, which has a shape and size to enclose the identified object with additional spacing around the perimeter. Next, the size of the expanded segment is reduced to form the wide segment such that the wide segment does not overlap any of the adjacent expanded objects.

23 Claims, 18 Drawing Sheets

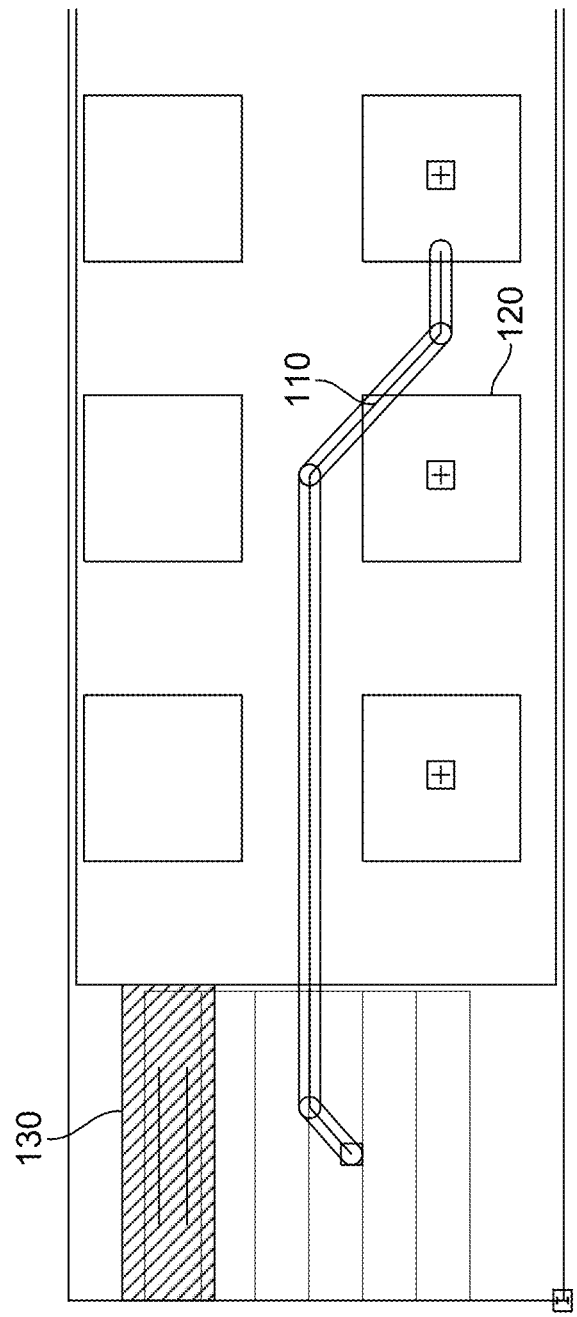

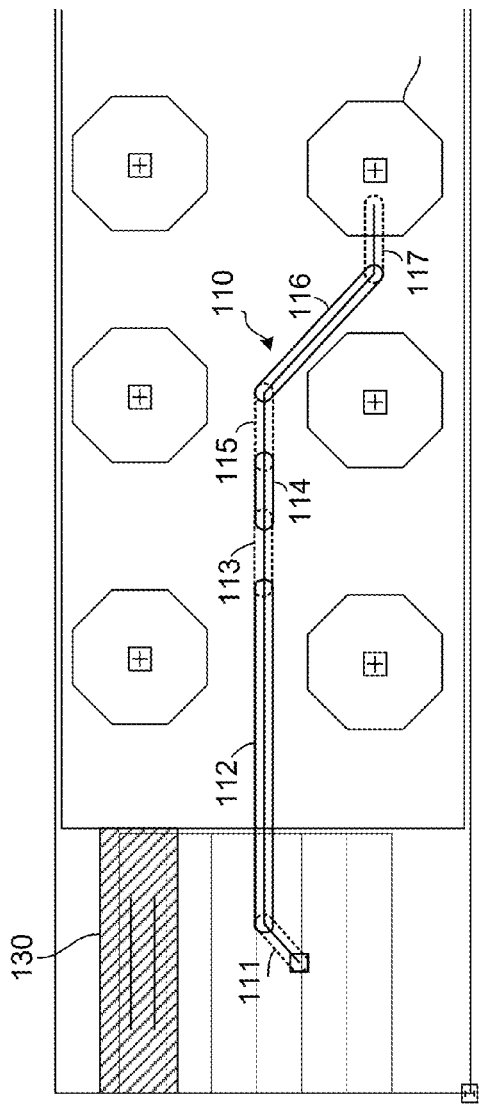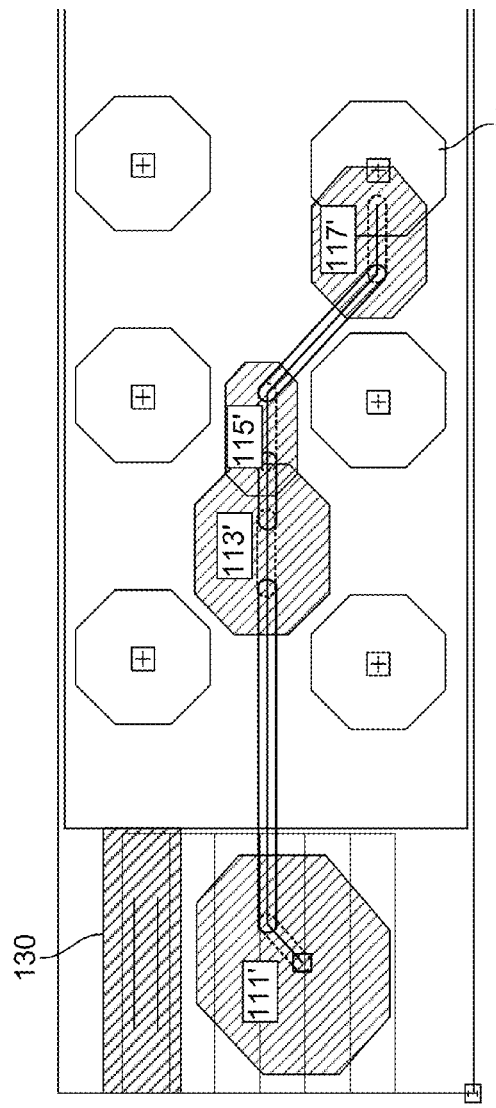

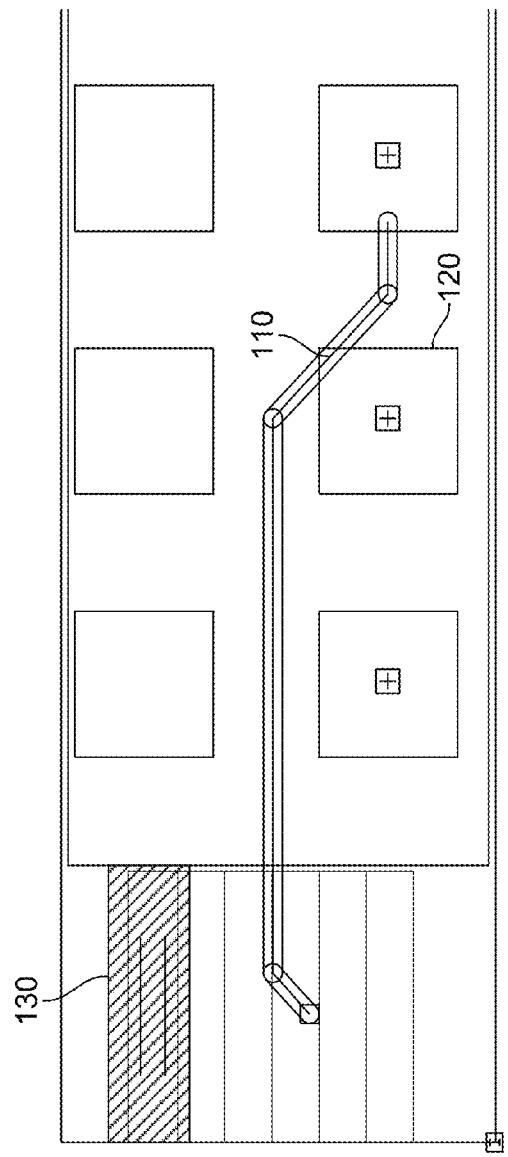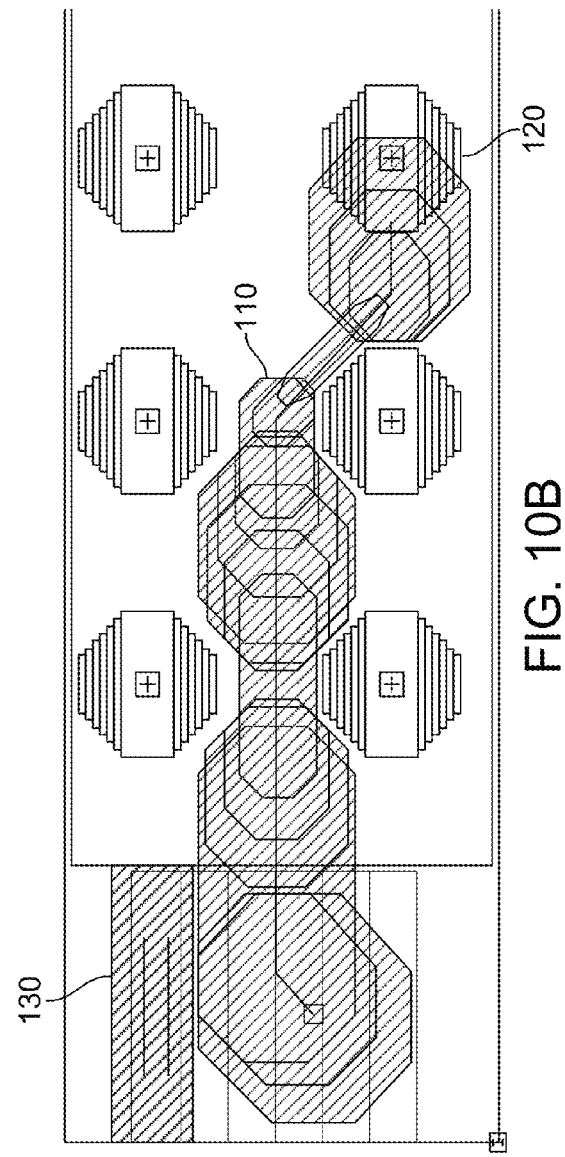

Rotates 45-degree axis

Normal axis

METHOD FOR WIRE WIDENING IN CIRCUIT ROUTING SYSTEM

CROSS-REFERENCES TO RELATED APPLICATIONS

The present application claim priority to U.S. Provisional Patent Application No. 61/918,646, filed Dec. 19, 2013, entitled "METHOD FOR WIRE WIDENING IN CIRCUIT ROUTING SYSTEM," commonly assigned and incorporated herein by reference in its entirety.

The present application is related to concurrently filed U.S. patent application Ser. No. 14/576,108, filed Dec. 18, 2014, entitled "IR-AWARE SNEAK ROUTING", which is commonly assigned and incorporated herein by reference in its entirety.

BACKGROUND OF THE INVENTION

The present invention relates to computer aided design (CAD) of integrated circuits (IC), and more particularly to improving wire routing in IC layout.

Wires in an integrated circuit are typically layers of conductive metal material such as copper or aluminum that are separated by layers of insulating material such as silicon dioxide. The metal layers are patterned using photolithographic techniques to form the wires for interconnecting the electrical elements in an integrated circuit. The layout design of a complex IC may, in part, be automated such that the location of interconnection wires is determined with the aid of CAD software called a router. For example, FIG. 1 shows part of an integrated circuit layout diagram generated by a conventional automated routing and layout tool. It can be seen that a wire 110 is placed to connect a contact pad 120 to a circuit 130.

BRIEF SUMMARY OF THE INVENTION

With the advancement of semiconductor fabrication technology, the dimension of devices integrated on an IC is becoming smaller. As a result, the electrical resistance of long and thin wires that connect the individual devices can cause a substantial voltage drop (sometimes referred to as current-resistance voltage drop or IR drop) and can significantly degrade the performance of the IC. Therefore, it is desirable to increase the width of routing wires to reduce electrical resistance, increase current flow, and reduce signal propagation time. However, with increasingly complex integrated circuits and layout geometry, many challenges arise. For example, because of the complex layout geometry, a wire often needs to be divided into multiple segments, and each segment is widened locally. Conventional wire-widening tools are often inadequate to handle these challenges. For example, conventional tools often fail to fully utilize available layout space. Some conventional tools may use ad hoc or iterative methods that require large computing resources and long run time and, therefore, are inefficient and costly. Accordingly, there is a need for improved method for automated wire widening.

Embodiments of the present invention provide methods and systems for wire-widening that are simple and efficient, and also utilize available space effectively. In some embodiments, the wire is divided into segments, and each segment is replaced by a widened segment. The proper spacing to adjacent objects is maintained by reducing the widened segment to avoid overlap with adjacent objects. In some embodiments, the wire is divided into segments of a preset minimum length, and each segment is replaced by a widened segment of a preset shape having a preset maximum width. The proper spacing to adjacent objects is maintained by reducing the widened segment to avoid overlap with adjacent objects. The simple algorithm can be executed efficiently, and available layout space in a complex geometry can be utilized effectively. In some embodiments, the preset shape for the widened segments is octagon. Since an octagon can be defined by two end points and a width, the widening and resizing or reduction of the octagons can be manipulated with just one parameter, the width. Therefore, embodiments of the invention can further reduce computational complexity of wire widening in a layout which has predominately horizontal, vertical, and 45-degree angles. Accordingly, the wire widening can be carried out in shorter time, use less computing resources such as process power and storage space, and be more cost-effective.

According to some embodiments of the invention, in an automatic integrated circuit routing tool implemented in a computer system having one or more computer processors and a computer-readable storage medium, a method for widening a wire in a layout includes, retrieving from the computer-readable storage medium a description of the layout that includes the wire and a plurality of objects adjacent to the wire. The method also includes dividing the wire into a plurality of segments, using one or more of the computer processors, each of the plurality of segments having a length extending from a first end point to a second end point. For each of at least a subset of the plurality of segments, using one or more of the computer processors, a wide segment is formed that does not overlap any adjacent objects. In some embodiments, an expanded segment is first formed and then reshaped, resized, or reduced to form a wide segment such that the wide segment does not overlap any adjacent objects. The method also includes replacing each segment of the wire with the corresponding wide segment to for a widened wire.

In another embodiment of the above method, forming a wide segment includes forming an intermediate, or expanded, segment that includes the first and the second end points and has a size such that the expanded segment overlaps with at least a region of an adjacent object. The method includes identifying regions in the adjacent objects that overlap with the expanded segment. For each of the identified regions, an expanded region is formed, using one or more of the computer processors. The expanded region has a shape and size to enclose the identified object with additional spacing around the perimeter of the region. Next, the size of the expanded segment is reduced to form the wide segment such that the wide segment does not overlap any of the adjacent expanded objects.

In a specific embodiment, each of the expanded segments has an initial width equal to a preset maximum width. In an embodiment, an adjacent object is identified as overlapping with the expanded segment if a distance between the adjacent object and the expanded segment is less than a preset spacing limit. In an embodiment, reducing the size of the expanded segment includes determining a largest overlap size from overlaps between the expanded segment and the expanded objects, and reducing the size of the expanded segment by the largest overlap size to form the wide segment that does not overlap any of the adjacent expanded objects.

In another embodiment, determining a largest overlap size includes determining a largest length of overlapped regions in the x-direction; and determining a largest length of overlapped regions in the y-direction. In another embodiment, the method also includes forming a first rectangular boundary box that contains the expanded segment, a forming a second rectangular boundary box that contains the expanded object, and determining a largest overlap size of overlap between the first rectangular boundary box and the second rectangular boundary box. In another embodiment, determining a largest overlap size also includes rotating the expanded segment and the expanded object by 45 degrees and determining a largest length of overlapped regions in the x-direction or the y-direction. In an embodiment, each of the expanded segments includes an octagon. In an embodiment, each of the expanded regions includes an octagon.

According to another embodiments of the invention, in a computer-implemented circuit routing tool, a method is provided for widening a wire in a layout that also includes a plurality of objects adjacent to the wire. The method includes dividing the wire into a plurality of segments, using one or more of the computer processors. Each segment has a length extending from a first end point to a second end point. For each of the plurality of segments, the segment is expanded, using one or more of the computer processors, to form an expanded segment that overlaps with at least a region of an adjacent object, the expanded segment being an octagon having a characteristic width W such that four of eight vertices of the octagon is a distance D away from the first end point and the other four vertices is the distance D away from the second end point, with D being a fraction of W. The method also includes identifying adjacent objects that overlap with the expanded segment. For each of the identified objects, an expanded object is formed, using one or more of the computer processors. The expanded object has a shape and size to enclose the identified object with additional spacing around the perimeter of the object. The method also includes determining a largest overlap size from overlaps between the expanded segment and the expanded object, and reducing the characteristic width of the expanded segment by the largest overlap size to form a wide segment that does not overlap any of the adjacent objects. The method further includes replacing each segment of the wire with a corresponding wide segment to form a widened wire.

In a specific embodiment of the above method, the expanded segment includes an octagon having a characteristic width W such that four of eight vertices of the octagon being W/2 away from the first end point and the other four vertices being W/2 away from the second end point. In another embodiment, in the length of each of the plurality of segment is a preset minimum length. In an embodiment, the characteristic width of the octagon is a preset maximum width. In another embodiment, the method also includes combining adjacent wide segment that have the same width to form an extended wide segment. In an embodiment, an adjacent object is identified as overlapping with the expanded the segment if a distance between the adjacent object and the expanded segment is less than a preset spacing limit. In an embodiment, the method also includes forming a first rectangular boundary box that contains the expanded segment, forming a second rectangular boundary box that contains the expanded object, and determining a largest overlap size of overlap between the first rectangular boundary box and the second rectangular boundary box. In another embodiment, the method also includes determining a largest overlap size further comprising rotating the expanded segment and the expanded region by 45 degrees.

In another embodiment of the above method, forming a wide segment includes expanding the segment to form an expanded segment that includes the first and the second end points and has a size such that the expanded segment overlaps with at least a region of an adjacent object. The method includes identifying regions in the adjacent objects that overlap with the expanded segment. For each of the identified regions, an expanded region is formed, using one or more of the computer processors. The expanded region has a shape and size to enclose the identified region with additional spacing around the perimeter of the region. Next, the size of the expanded segment is reduced to form the wide segment such that the wide segment does not overlap any of the adjacent expanded objects.

According to one embodiment of the present invention, a computer system for performing wire widening in integrated circuit layout is configured to divide the wire into a plurality of segments. Each of the plurality of segments has a length extending from a first end point to a second end point. The system is further configured to, for each of at least a subset of the plurality of segments, form a wide segment that does not overlap any adjacent objects. The system is further configured to replace each of the at least the subset of segments of the wire with an associated wide segment to form a widened wire.

In an embodiment of the above system, in order to form a wide segment, the system is further configured to form an expanded segment that includes the first and the second points and has a characteristic width such that the expanded segment overlaps with at least a region of an adjacent object. The system is further configured to identify regions in the adjacent objects that overlap with the expanded segment. The system is further configured to, for each of the identified regions, form an expanded region. The expanded region has a shape and size to enclose the identified region with a spacing around the perimeter of the region. The system is further configured to determine a largest overlap size from overlaps between the expanded segment and the expanded regions. The system is further configured to reduce the characteristic width of the expanded segment by the largest overlap size such that the expanded segment does not overlap any of the adjacent expanded regions, resulting in a wide segment that does not overlap any adjacent object.

According to one embodiment of the present invention, a non-transitory computer-readable storage medium includes instructions which, when executed by a computer, cause the computer to divide the wire into a plurality of segments. Each of the plurality of segments have a length extending from a first end point to a second end point. The instructions further causes the computer to, for each of at least a subset of the plurality of segments, form an associated wide segment that does not overlap any adjacent objects, and replace each of the at least the subset of segments of the wire with a corresponding wide segment to form a widened wire.

In an embodiment of the above non-transitory computer-readable storage medium, the instructions for forming a wide segment further cause the computer to form an expanded segment that includes the first and the second points and has a characteristic width such that the expanded segment overlaps with at least a region of an adjacent object. The instructions further cause the computer to identify regions in the adjacent objects that overlap with the expanded segment, and for each of the identified regions, to form an expanded region. The expanded region has a shape and size to enclose the identified region with a spacing around the perimeter of the region. The instructions further cause the computer determine a largest overlap size from overlaps between the expanded segment and the expanded regions, and to reduce the characteristic width of the expanded segment by the largest overlap size such that the expanded segment does not overlap any of the adjacent expanded regions, resulting in a wide segment that does not overlap any adjacent object.

BRIEF DESCRIPTION OF THE DRAWINGS

FIG. 1 is a simplified schematic top layout view of an integrated circuit, as known in the prior art;

FIGS. 2A, 2B, 2C, and 2D are top view layout diagrams illustrating a method for wire widening according to an embodiment of the present invention;

FIGS. 10A and 10B are simplified layout diagrams illustrating the widening of a portion of integrated circuit of FIG. 1;

DETAILED DESCRIPTION OF THE INVENTION

Figure 2A:
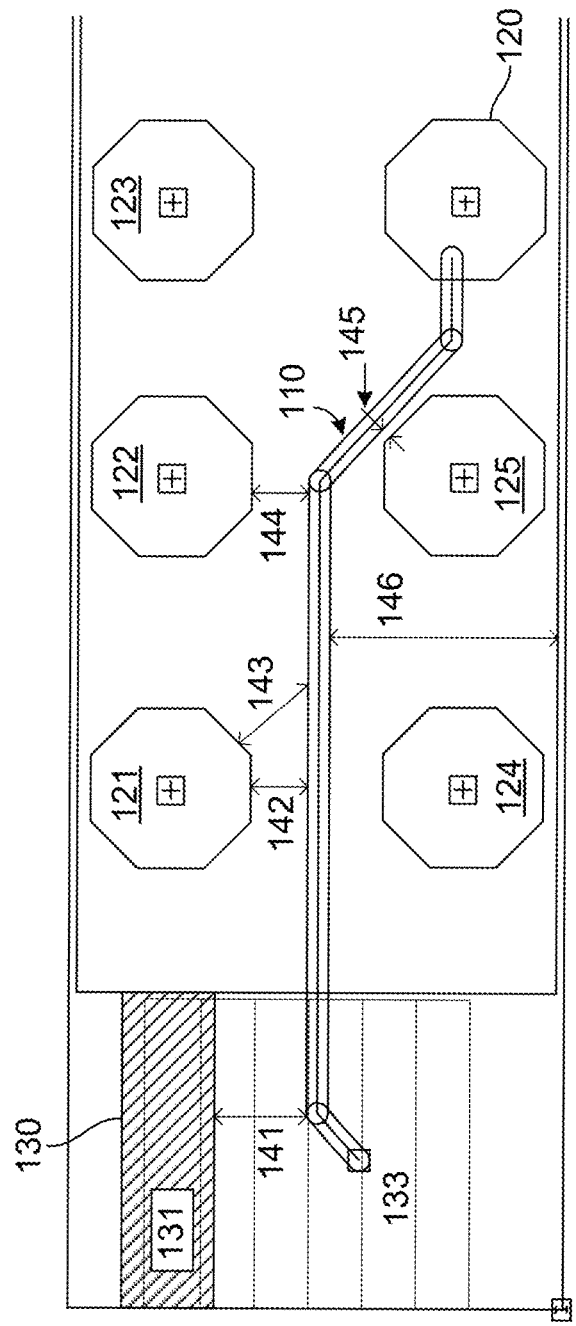

FIGS. 2A, 2B, 2C, and 2D are top view layout diagrams illustrating a method for wire widening according to an embodiment of the present invention. The method for widening a wire in a layout for an automatic integrated circuit routing tool is implemented in a computer system. The computer system may have one or more computer processors and a computer-readable storage medium, as will be described in more detail in connection with FIG. 15. In some embodiments, a description of the layout can be retrieved from the computer-readable storage medium, and certain routing and layout functions are performed when computer programmable instructions or codes are retrieved from the storage media and executed by a processor. As illustrated in FIG. 2A, a wire 110 is placed in a layout that also includes a plurality of objects adjacent to the wire. In FIG. 2A, wire 110 is disposed to connect pad 120 to a point 133 in a circuit 130. The adjacent objects include pads 121-125 and a block 131 in circuit 130. In integrated circuits, it is often desirable to widen the wires to reduce electrical resistance. As illustrated in FIG. 2A, the spacing between wire 110 and the adjacent objects can vary greatly, as marked by distances 141-146. The spaces can be used for wire widening. However, variations in spacing can make it difficult to efficiently utilize the available spaces in wire widening.

Figure 2D:
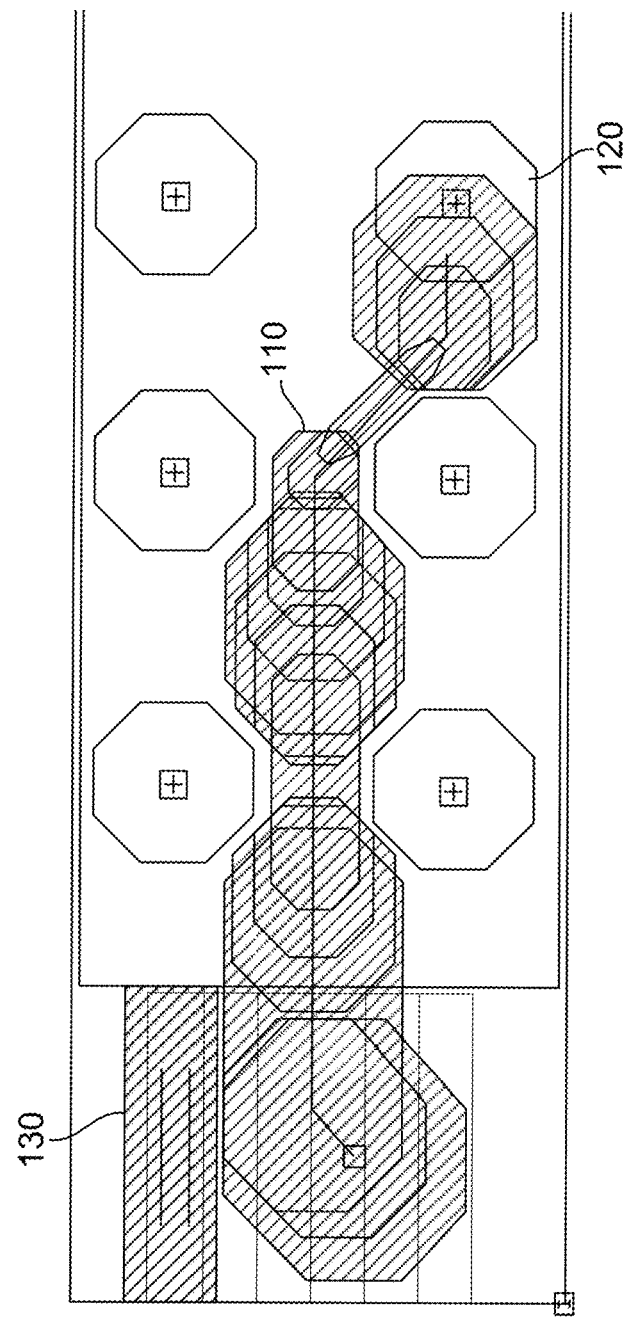

In embodiments of the invention, a method of wire widening includes dividing the wire into a plurality of segments, using one or more of the computer processors. Each of the plurality of segments has a length extending from a first end point to a second end point. As shown in FIG. 2B, wire 110 is divided into segments 111-117. Segments 111, 113, 115, and 117 are illustrated in dotted lines for clarity. The method includes, for each of the plurality of segments 111-117, forming a wide segment that does not overlap any adjacent objects, and replacing each segment of the wire with the corresponding wide segment to form a widened wire. As shown in FIG. 2C, segments 111, 113, 115, 117 are replaced with wide segments 111', 113', 115', and 117'. In the embodiment shown in FIG. 2C, the wide segments have octagon shapes and are widened without overlapping adjacent shapes. It can be seen that each segment is widened by a different amount, depending on the available space. In some cases, there may not be available space for widening a segment. For example, a segment may already be separated to adjacent objects by the minimum spacing allowed by the design rules. This situation may be uncovered during the computational process for the method, and new segment is formed which may or may not be wider than the original segment. Therefore, the term "wide segment" as used herein represents a segment derived from an original segment using a method described herein, and the width of the "wide segment" may be greater than, or equal to, the width of the original segment. FIG. 2D illustrates a computer generated wide wire that includes many wide segments that are expanded from short segments in the original wire 110.

Figure 3:
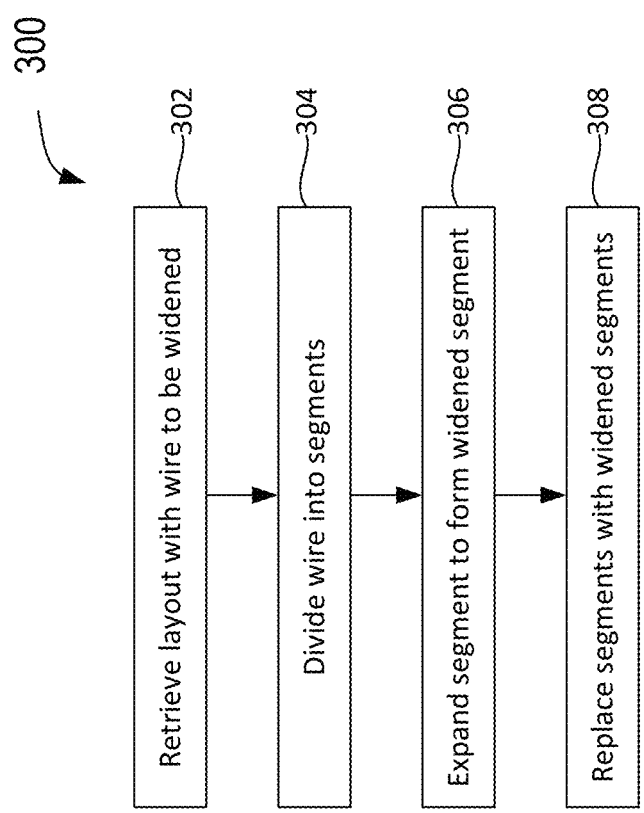
FIG. 3 is a flowchart illustrating a method for wire widening according to an embodiment of the present invention.

The method for wire widening described above is summarized in the flowchart in FIG. 3 and includes the following steps:

Step 302, retrieving from the computer-readable storage medium a description of the layout that includes the wire to be widened and a plurality of objects adjacent to the wire;

Step 304, dividing the wire into a plurality of segments, using one or more of the computer processors, each segment having a length extending from a first end point to a second end point;

Step 306, for each of the plurality of segments, using one or more of the computer processors, forming an expanded segment, also referred to herein as an intermediate segment, and reshaping the expanded segment to form a wide segment or widened segment, also referred to herein as a final segment, that does not overlap any adjacent objects; and Step 308, replacing each segment of the wire with the corresponding wide or widened segment to form a widened wire.

In some embodiments of the above method, the process of forming a wide segment includes expanding the segment to form an expanded segment that includes the first and the second end points and has a size such that the expanded segment overlaps with at least a region of an adjacent object. The method includes identifying regions in the adjacent objects that overlap with the expanded segment. For each of the identified regions, an expanded region is formed, using one or more of the computer processors. The expanded region can have a shape and size to enclose the identified object with additional spacing around the perimeter of the region. Next, the size of the expanded segment is reduced to form a wide segment, also referred to as a widened segment, such that the wide segment does not overlap any of the adjacent expanded objects.

In a specific embodiment, each of the expanded segments has an initial width equal to a preset maximum width. In an embodiment, an adjacent object is identified as overlapping with the expanded segment if a distance between the adjacent object and the expanded segment is less than a preset spacing limit. In an embodiment, reducing the size of the expanded segment includes determining a largest overlap size from overlaps between the expanded segment and the expanded objects, and reducing the size of the expanded segment by the largest overlap size to form the wide segment that does not overlap any of the adjacent expanded objects.

Figure 4:
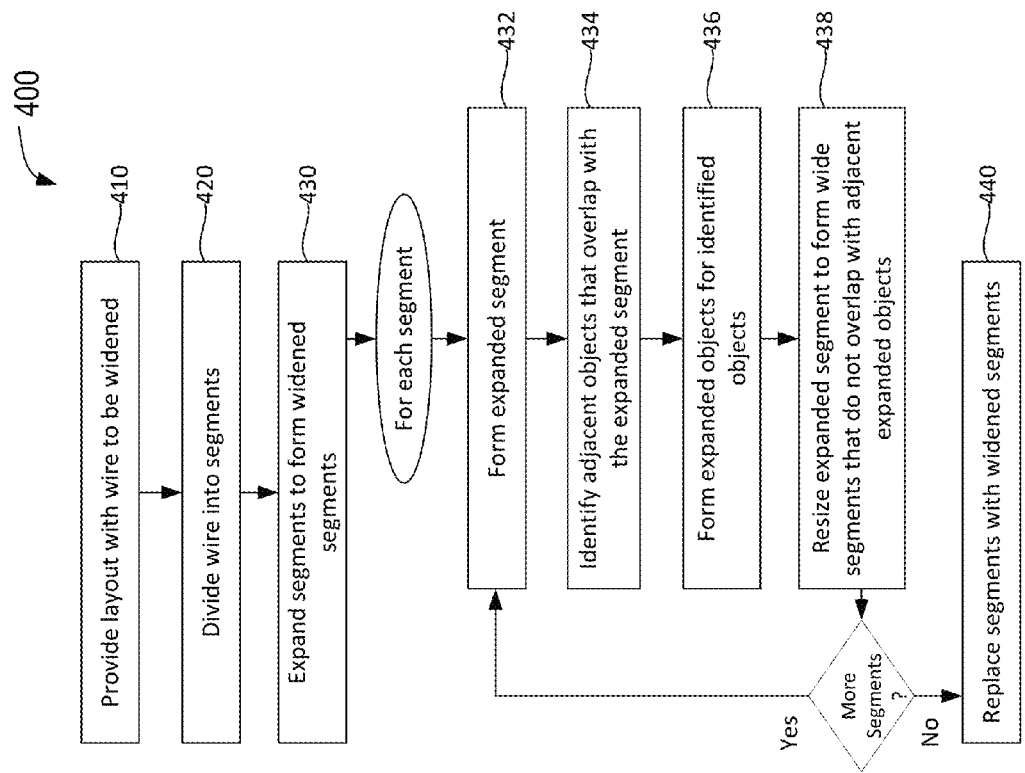
FIG. 4 is a flowchart illustrating a method in a computer-implemented circuit routing tool for wire widening according to another embodiment of the present invention.

FIG. 4 is a flowchart illustrating a method in a computer-implemented circuit routing tool for wire widening according to another embodiment of the present invention. The method is described below in more detail with reference to the flow chart and FIGS. 5-9.

Figure 5:
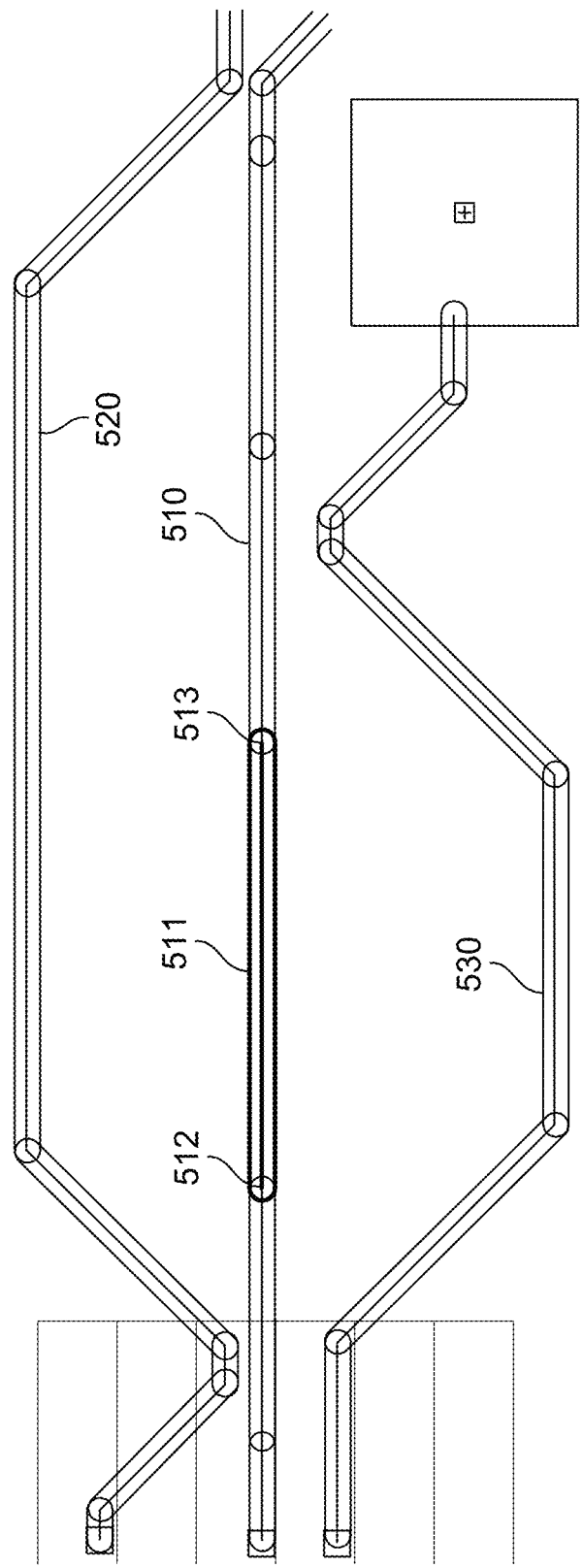
FIGS. 5-9 are simplified diagrams illustrating the steps in the method for wire widening summarized in FIG. 4.

In step 410 in the flowchart of FIG. 4, the method start with a layout that includes a wire and a plurality of objects adjacent to the wire. As shown in FIG. 5, a wire 510 is to be widened. In this example, adjacent shapes are represented by wires 520 and 530. The spacing between wire 510 and wires 520 and 530 can be used for widening wire 510. As in practical integrated circuit layouts, the spacing is often irregular. In other examples, the adjacent objects can include other types of circuit elements such as contact pads and bumps, or other devices. The objects can include wires, lines, bumps, vias, and other shapes, etc. Further, in the example of FIG. 5, wires 520 and 530 are shown to have polygons that have edges that are either in the horizontal direction or slanted at a 45° angle. In this embodiment, the adjacent objects are the straight segments in wires 520 and 530. In other examples, the objects can be represented by polygons that have edges that are either in the vertical direction or slanted at a 45° angle. Of course, in other embodiments, different shapes can also be used, and the methods presented here are also applicable. As described below, embodiments of the present invention provide methods for wire widening that are efficient and effective with these geometries.

In step 420 in the flowchart of FIG. 4, the wire line is divided into a plurality of segments, using one or more of the computer processors. Each segment has a length extending from a first end point to a second end point. In FIG. 5, a segment 511 of wire 510 is shown between end points 512 and 513. In embodiments of the present invention, the wire is divided into segments for widening with respect to local geometry. The number of segments and the length of each segment are selected based on the circuit layout and performance requirement. For example, a high number of short segments allow for optimized wire widening to utilize the available space in various local regions of an irregular space. However, the high utilization comes with a higher cost of computing time and storage. In an embodiment of the present invention, the length of each segment is fixed at a preselected minimum segment length. This strategy simplifies the algorithm and provides effective utilization of available space. In FIG. 5, for ease of explanation, only one segment 511 having a relatively long length is shown as an example. In FIG. 5, segment 511 is shown between a first end point 512 and a second end point 513.

Figure 6:
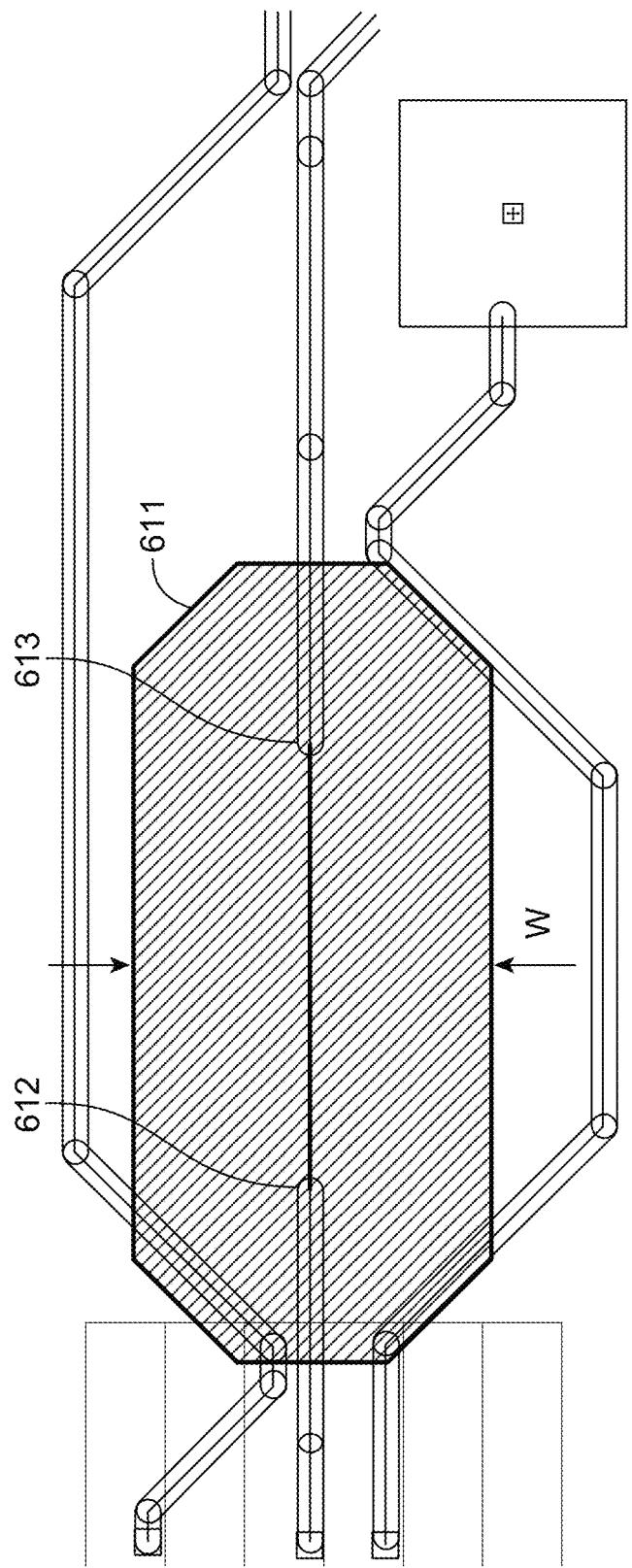

In step 430 in the flowchart of FIG. 4, for each of the plurality of segments, an expanded segment is formed by expanding the segment to form a wide segment that has a maximum size without overlapping with any adjacent objects. FIGS. 6-9 illustrate a process for forming such a maximum-sized octagon according to an embodiment of the invention. First, in step 432, an expanded segment is formed using one or more of the computer processors. In the example shown in the FIG. 6, the expanded segment 611 is an octagon that includes an elongated portion having a width W and eight vertices, with four vertices near each of the two end points 612 and 613. In some embodiments, the octagon has a characteristic width W, which is the width of the elongated portion, and W also defines the distance between the vertices and the corresponding end points. In the embodiment shown in FIG. 6, the distance between the vertices and the corresponding end point is a fraction of W, which is slightly greater than W/2. In some embodiments, four of eight vertices of the octagon is W/2 away from the first end point 611 and the other four vertices is W/2 away from the second end point 612. In these cases, an octagon can be represented by two end points and a characteristic width W. Thus, the computation and handling algorithms can be simplified. Further simplification can be obtained when the six short sides near the vertices are held constant, as shown in FIG. 6. In some embodiments, the width W is a preset maximum value. In alternative embodiments, the maximum width is a preset maximum width plus wire-to-wire spacing required by the design rules. In embodiments of the invention, the wire-to-wire spacing can vary with different nets. For example, a spacing to a power line Vdd can be 5 um, and a spacing to a ground line Vss can be 10 um. In an embodiment, the characteristic width is set to equal to a preset maximum width such that the expanded segment overlaps with at least one of the adjacent objects.

Figure 7:
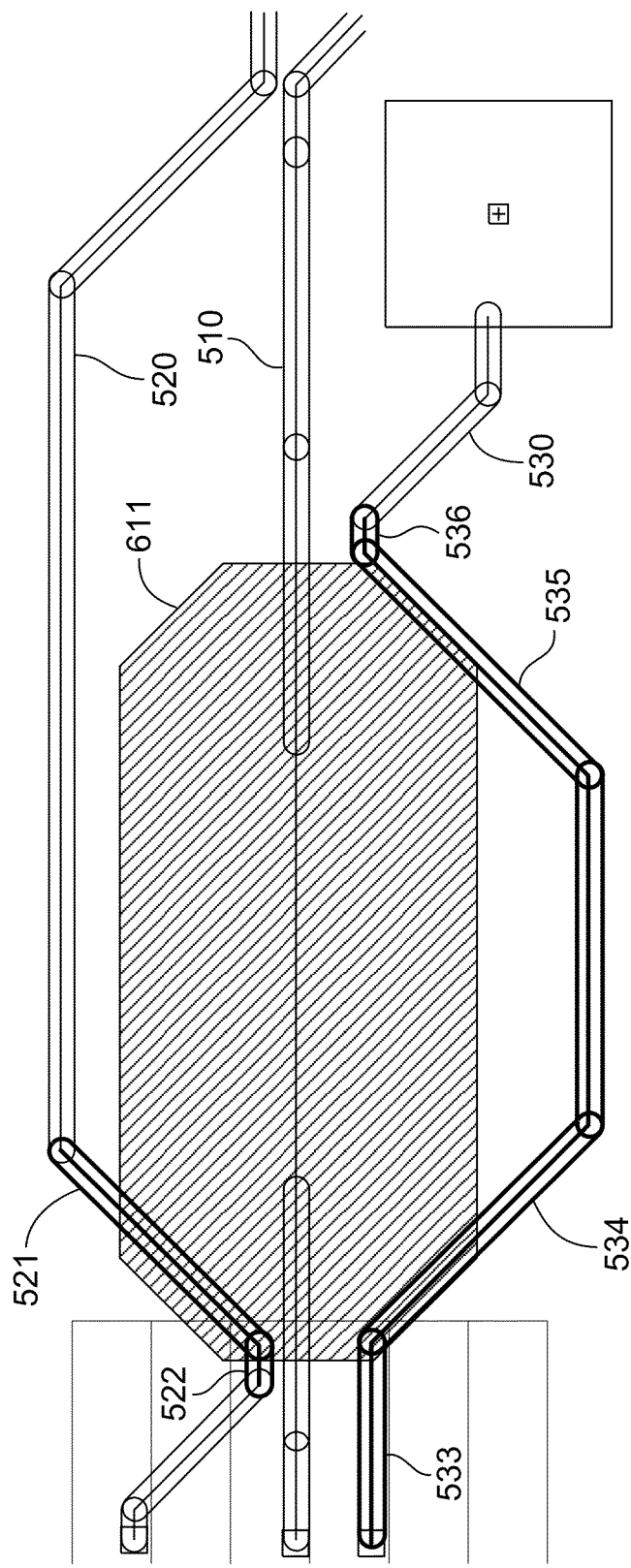

In step 434 in the flowchart of FIG. 4, adjacent objects that overlap with the expanded segment are identified. As shown in FIG. 7, objects 521 and 522 in adjacent wire 520 are identified and highlighted that overlap with the expanded segment 611. Similarly, objects 531, 532, 533, and 534 of adjacent wire 530 are identified and highlighted, because they overlap with the expanded segment 611. In the example of FIG. 7, the term "object" refers to a straight section of wires 520 or 530. In other embodiments, the term "object" can be a shape in the layout drawing that can be expanded.

Figure 8:
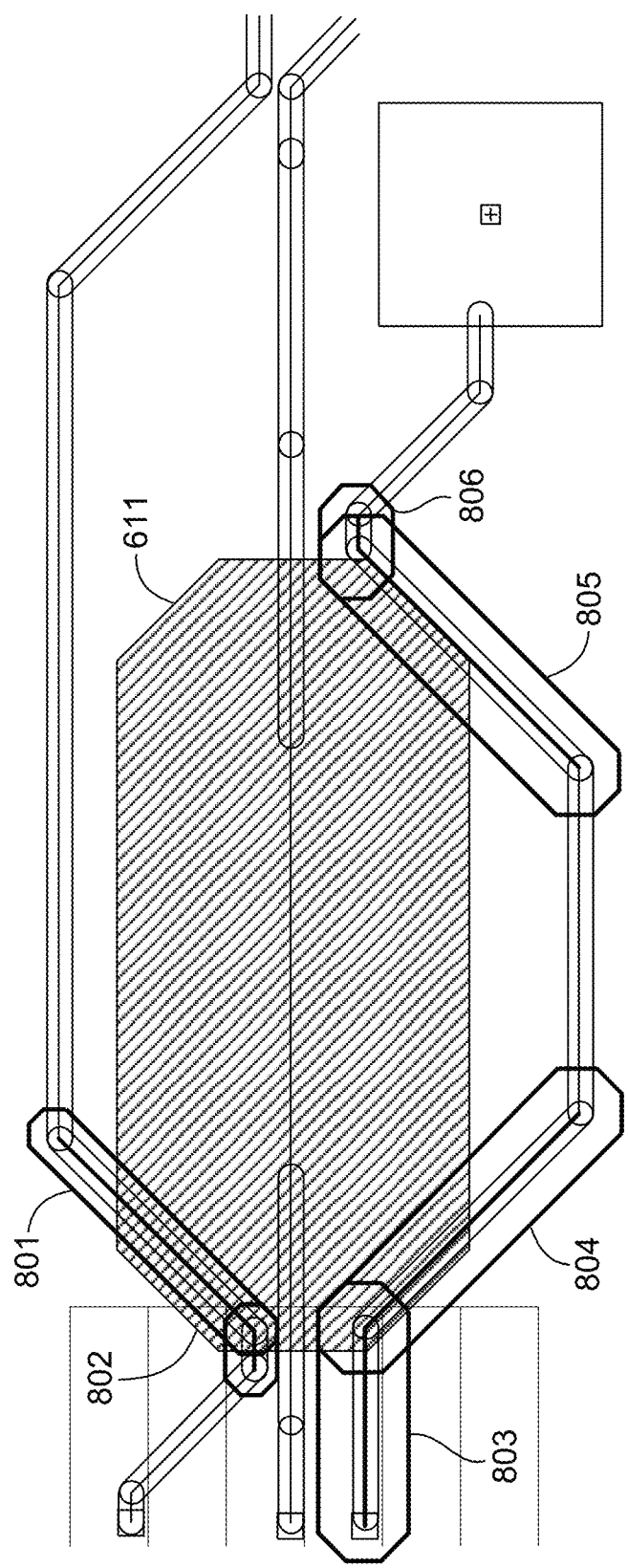

In step 436 in the flowchart of FIG. 4, for each of the identified objects that overlap with the expanded segment, an expanded object is formed, using one or more of the computer processors. The expanded object has a shape and size to enclose the identified object and with spacing around the perimeter of the object. In the example shown in FIG. 8, each of the expanded objects, 801-806, is an octagon that includes the overlapped object and is expanded at the perimeter to include a wire-to-wire spacing required by, e.g., the design rule checker (DRC). Here, the octagon can be defined using a characteristic width W as described above. The expanded object would be an octagon whose characteristic width would be W plus the desired spacing. Thus, it can be seen that the adjacent "object" as depicted in FIGS. 6-8 refer to a straight section of a wire, which has two end points and can be replaced by an octagon defined by the end points. In other embodiments, an adjacent object can have any shape, and a corresponding expanded object can be defined as a shape that encloses the object and also provides desired spacing along the perimeter. In some embodiments, an adjacent object is identified as overlapping with the expanded the segment 611 if a distance between the adjacent object and the expanded segment 611 is less than a preset spacing limit.

Figure 9:
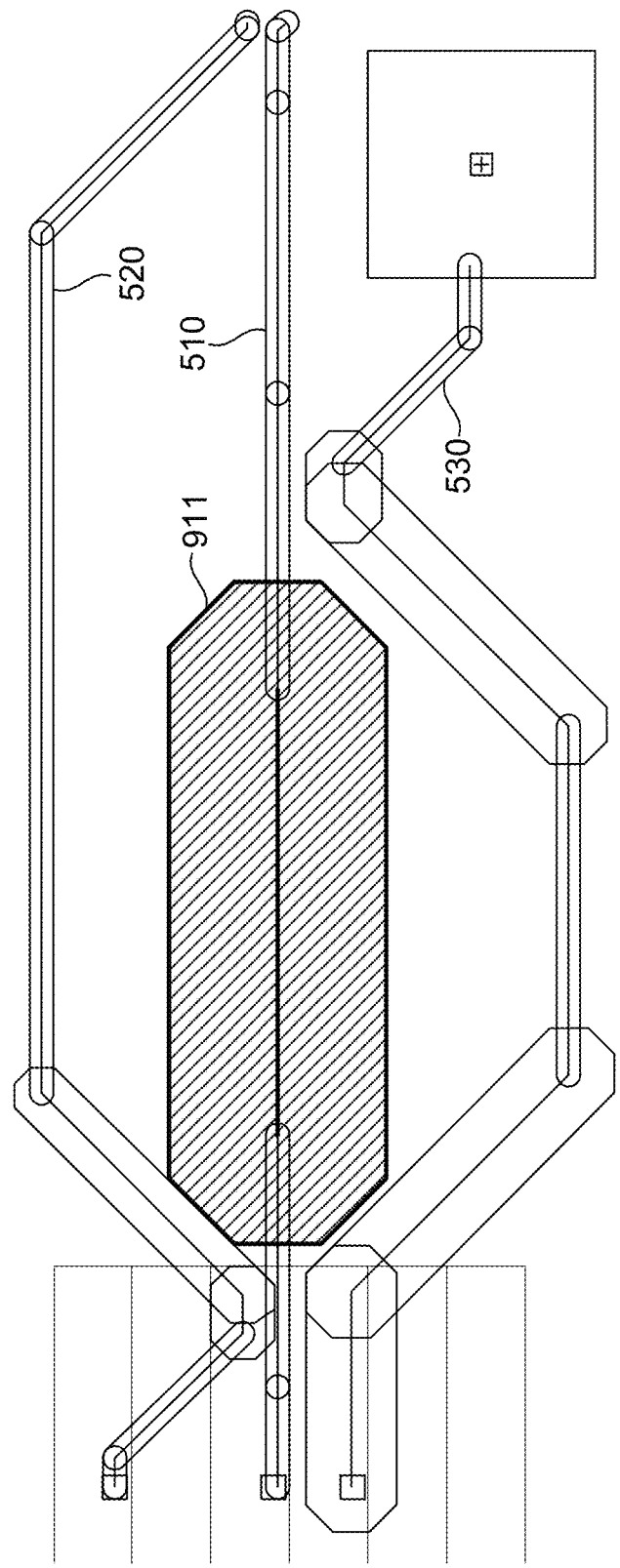

In step 438 in the flowchart of FIG. 4, the characteristic width of the expanded segment 611 is reduced such that the expanded segment does not overlap any of the adjacent expanded objects, resulting in a wide segment. Here, a process is first carried out to determine the largest overlap size from the overlapped regions between the expanded segment and the expanded objects. Then, the characteristic width of the expanded segment 611 is reduced such that the largest overlap is avoided. An example of determining the overlap is described in more detail below. Here, FIG. 9 shows a wide segment or widened segment 911 derived from expanded segment 611 in FIG. 8. It can be seen that edges of widened segment 911 is pushed close to adjacent wires 520 and 530 without violating the spacing rules.

The above process is repeated for each of the segments to convert each segment into a corresponding widened segment. In step 440 in the flowchart of FIG. 4, the method involves replacing each segment of the wire with the corresponding wide segment to form a widened wire. FIGS. 10A and 10B are simplified layout diagrams illustrating the wire widening for a portion of integrated circuit of FIG. 1 in which wire 110 connects pad 120 to circuit 130. FIG. 10B shows an example of a wire widened by applying the wire widening method to the wire in FIG. 10A, which shows a portion of the layout in FIG. 1. As shown in FIG. 10B, the widened wire 1010 forms a connection between pad 120 and circuit 130. Widened wire 1010 includes many widened segments which can reduce electrical resistance significantly and increase current flow. In FIG. 10B, pad 120 is part of the connected structure and is not treated as an adjacent object that needs to be separated from wire 1010. Therefore, signal propagation time can be reduced. In some embodiments, adjacent wide segment that have the same width can be combined into one combined wide segment.

In the example of FIG. 10B, both the expanded segment and the wide segment use using the octagon shape formed with respect to the first end point and the second end point of the original segment. This method contributes to the computational efficiency of the method. However, if the original segment is closer to one of the adjacent objects, the width of the symmetric octagon in the method could be limited by the spacing between the original segment and its closest neighbor. In the embodiment shown in FIG. 10B, the wide segments have octagon shapes and are widened without overlapping adjacent shapes. It can be seen that each segment is widened by a different amount, depending on the available space. In some cases, there may not be available space for widening a segment. For example, a segment may already be separated to one or more adjacent objects by the minimum spacing allowed by the design rules. In this case, a new segment is formed which may or may not be wider than the original segment. Therefore, the term "wide segment" as used herein represents a segment derived from an original segment using a method described herein, and the width of the "wide segment" may be greater than, or equal to, the width of the original segment.

In alternative embodiments, the method can include asymmetric octagons, which allow different amounts of expansion in the wide segment. In other embodiments, the first and second end points can be allowed to move away from the first and second end points of the original segment. In still other embodiments, irregular shapes can be used for expanded segments, and overlap with neighboring objects can be removed locally according to spacing design rules.

Figure 11B:
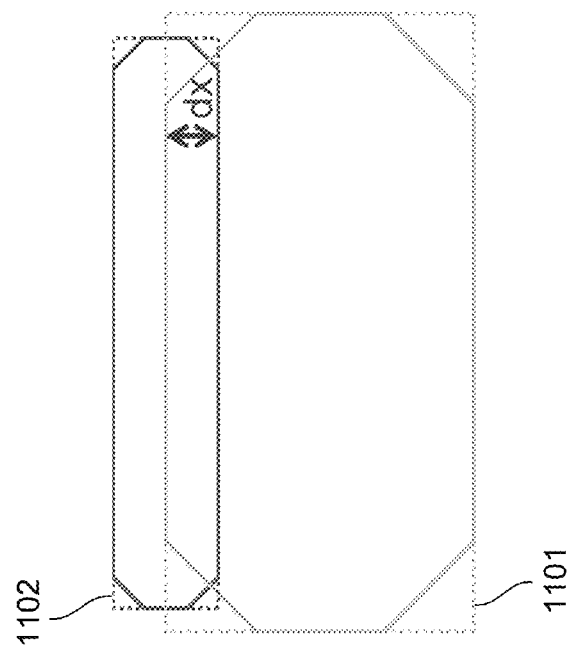
FIGS. 11A, 11B, 12A, 12B, 13A, 13B, 14A, and 14B illustrate a method for determining the extent of an overlapped region according to an embodiment of the present invention.
Figure 11A:
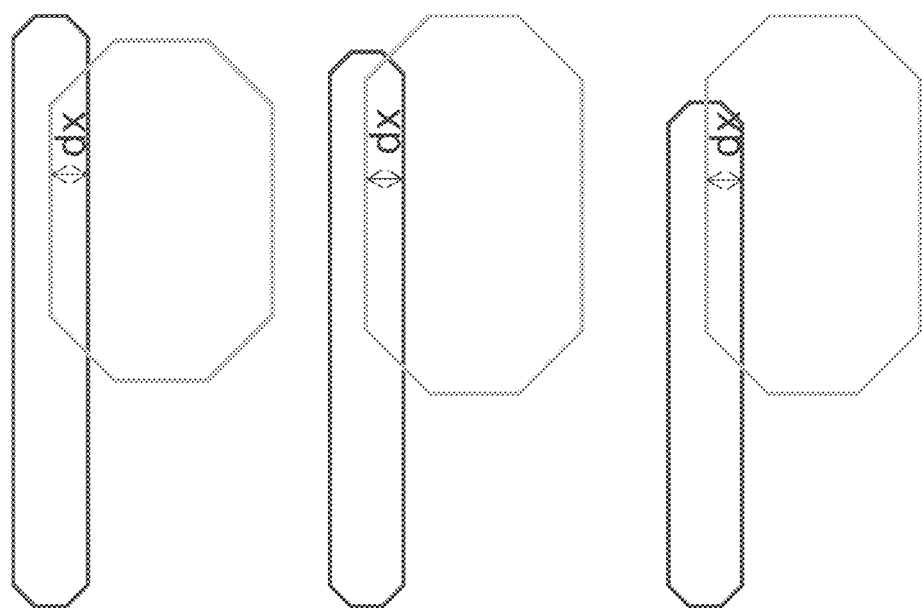

FIGS. 11A and 11B illustrate a method for determining the size of overlapped regions according to an embodiment of the present invention. In the description of step 438 of the flowchart of FIG. 4, a largest overlap size is determined, and the expanded segment is reduced such that the larges overlap is avoided. FIG. 11A illustrates two octagons overlapping at three different relative positions. In one embodiment, the overlapped region, including slanted portions, is analyzed and the largest overlap dx is determined. In another embodiment, a simpler process is provided. As shown in FIG. 11B, a rectangular boundary box is formed over each octagon. In this case, the largest overlap between the two octagons can be determined by the overlap of the two boundary boxes 1101 and 1102, which is dx.

Figure 12B:
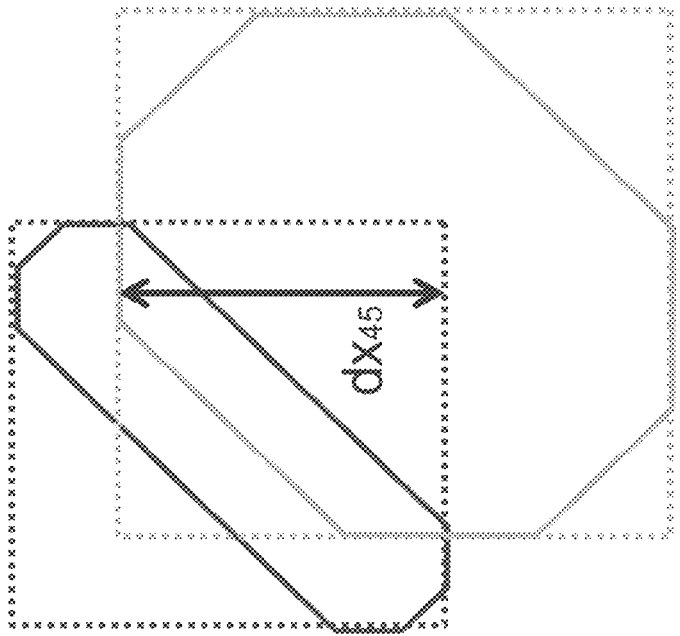
Figure 12A:
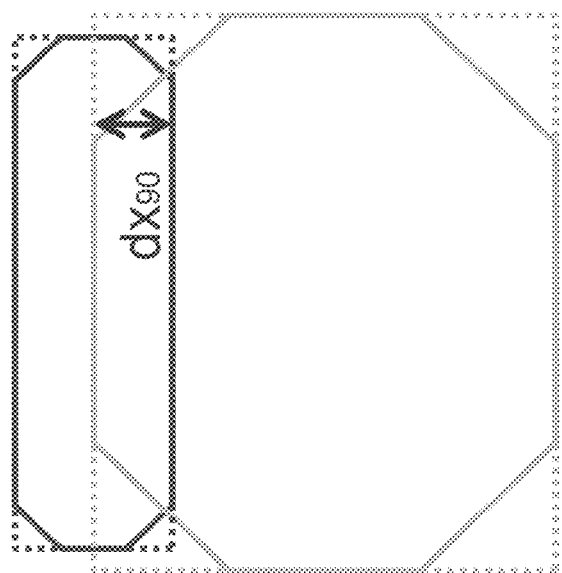

FIGS. 12A and 12B illustrate a method for determining the size of overlapped regions according to another embodiment of the present invention to illustrate the effect of rotation. FIG. 12A shows two shapes in the normal axes, and the size of overlap between two rectangular boundary boxes is shown to be dx90. FIG. 12B shows two shapes in axes rotated by 45 degrees, and the size of overlap between two rectangular boundary boxes is shown to be dx45. It can be seen that dx45 overestimates the overlap between the two octagons. Therefore, dx90 is the proper overlap size in this case.

Figure 13B:
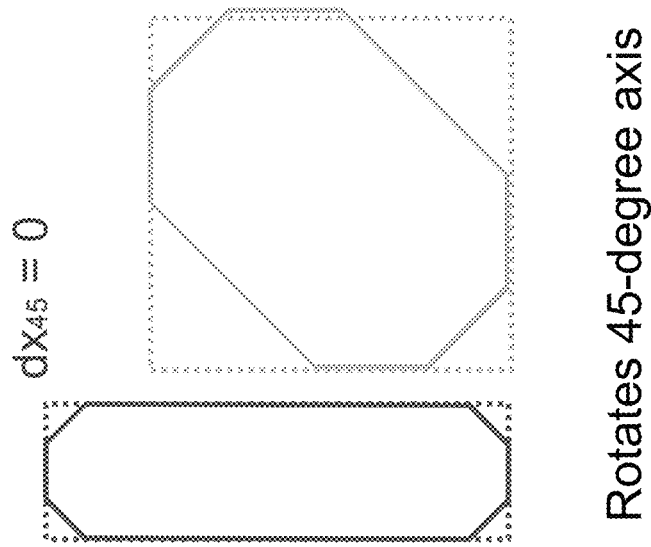
Figure 13A:
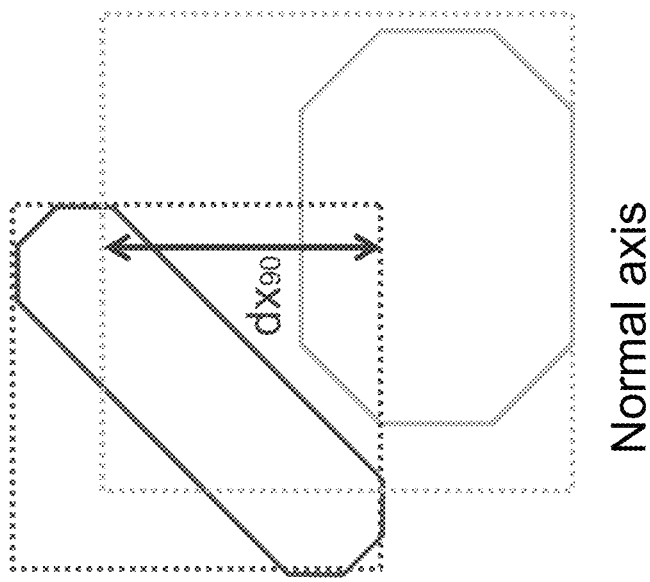

FIGS. 13A and 13B illustrate a method for determining the size of overlapped regions according to an embodiment of the present invention. FIG. 13A shows two shapes in the normal axes, and the size of overlap between two rectangular boundary boxes is shown to be dx90. FIG. 13B shows the two shapes in axes rotated by 45 degrees, and the size of overlap between two rectangular envelops is shown to be dx45=0. It can be seen that dx90 overestimates the overlap between the two octagons. Therefore, dx45 is the proper overlap size, and it indicates that there is no overlap in this case.

Figure 14B:
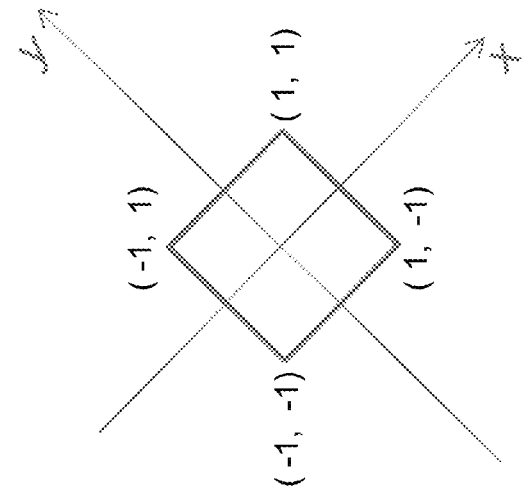
Figure 14A:
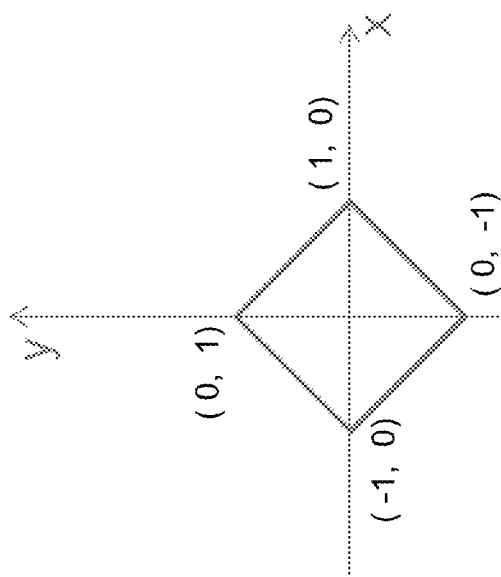

According to some embodiments of the invention, a method for determining the maximum or largest size of overlap between two shapes includes forming a boundary box around each shape. The method also includes measuring the overlap twice, once in the normal axes and a second time in the 45 degree axes. The smaller of these two measurements is the desired result. In an embodiment, the shape in the rotated axes is obtained by rotating the axes by 45-degree clockwise and multiplying the length by a scaling factor of $\sqrt{2}$. This transformation is illustrated in FIGS. 14A and 14B, and can be carried out according to the following equations, $$X_{45}=X_{90}-Y_{90}$$

$$Y_{45}=X_{90}+Y_{90}$$

where $X_{90}$ is X in normal axis, $Y_{90}$ is Y in normal axis, $X_{45}$ is X in rotated axis, and $Y_{45}$ is Y in rotated axis. As described above in connection to FIGS. 11A, 11B, 12A, 12B, 13A, and 13B, when two estimations are made with the boundary boxes in the normal axes and rotated axes, respectively, a more accurate determination of the size of overlap can be obtained. Using the rotational transformation illustrated in FIG. 14, the overlap is the minimum value of (dx90, dx45/$\sqrt{2}$).

Embodiments of the invention are described above using 45-degree and 90-degree routing as examples. However, it is understood that other geometries can also be used. For example, the bump shape may be an octagon. The design can also include rectangular shapes. The method described above of using the boundary boxes in the normal axes and rotated axes an also be applied in other geometries. In some embodiments, when most shapes in a design are constructed in other angle, the method can be applied with a different rotated angle.

In the examples described above, various objects or wires having 45-degree and 90-degree edges are used. It is understood, however, in other implementations, the EDA tool of the present invention can have objects having an angle other than 45 and 90 degrees depending on the application. Other angles such as 30 degrees, 60 degrees, curved, arced, other type of wire bends can also be implemented.

Figure 15:
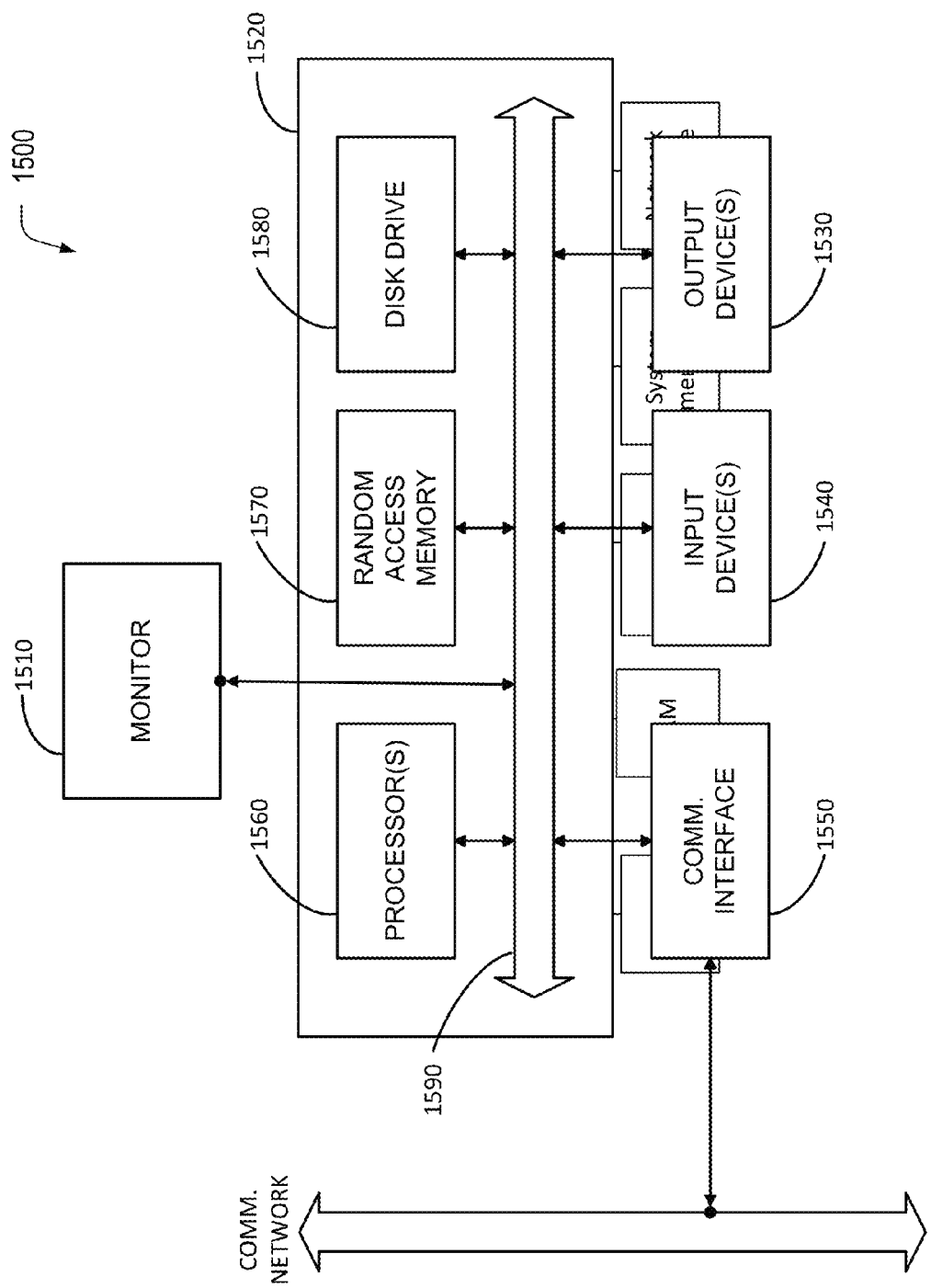
FIG. 15 is a simplified block diagram of a computer system that may incorporate embodiments of the present invention.

FIG. 15 is a simplified block diagram of a computer system that may incorporate embodiments of the present invention. FIG. 15 is merely illustrative of an embodiment incorporating the present invention and does not limit the scope of the invention as recited in the claims. One of ordinary skill in the art would recognize other variations, modifications, and alternatives.

In one embodiment, computer system 1500 typically includes a monitor 1510, a computer 1520, user output devices 1530, user input devices 1540, communications interface 1550, and the like.

As shown in FIG. 15, computer 1520 may include a processor(s) 1560 that communicates with a number of peripheral devices via a bus subsystem 1590. These peripheral devices may include user output devices 1530, user input devices 1540, communications interface 1550, and a storage subsystem, such as random access memory (RAM) 1570 and disk drive 1580.

User input devices 1530 include all possible types of devices and mechanisms for inputting information to computer system 1520. These may include a keyboard, a keypad, a touch screen incorporated into the display, audio input devices such as voice recognition systems, microphones, and other types of input devices. In various embodiments, user input devices 1530 are typically embodied as a computer mouse, a trackball, a track pad, a joystick, wireless remote, drawing tablet, voice command system, eye tracking system, and the like. User input devices 1530 typically allow a user to select objects, icons, text and the like that appear on the monitor 1510 via a command such as a click of a button or the like.

User output devices 1540 include all possible types of devices and mechanisms for outputting information from computer 1520. These may include a display (e.g., monitor 1510), non-visual displays such as audio output devices, etc.

Communications interface 1550 provides an interface to other communication networks and devices. Communications interface 1550 may serve as an interface for receiving data from and transmitting data to other systems. Embodiments of communications interface 1550 typically include an Ethernet card, a modem (telephone, satellite, cable, ISDN), (asynchronous) digital subscriber line (DSL) unit, FireWire interface, USB interface, and the like. For example, communications interface 1550 may be coupled to a computer network, to a FireWire bus, or the like. In other embodiments, communications interfaces 1550 may be physically integrated on the motherboard of computer 1520, and may be a software program, such as soft DSL, or the like.

In various embodiments, computer system 1500 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 1520 includes one or more Xeon microprocessors from Intel as processor(s) 1560. Further, one embodiment, computer 1520 includes a UNIX-based operating system.

RAM 1570 and disk drive 1580 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 1570 and disk drive 1580 may be configured to store the basic programming and data constructs that provide the functionality of the present invention.

Software code modules and instructions that provide the functionality of the present invention may be stored in RAM 1570 and disk drive 1580. These software modules may be executed by processor(s) 1560. RAM 1570 and disk drive 1580 may also provide a repository for storing data used in accordance with the present invention.

RAM 1570 and disk drive 1580 may include a number of memories including a main random access memory (RAM) for storage of instructions and data during program execution and a read only memory (ROM) in which fixed instructions are stored. RAM 1570 and disk drive 1580 may include a file storage subsystem providing persistent (non-volatile) storage for program and data files. RAM 1570 and disk drive 1580 may also include removable storage systems, such as removable flash memory.

Bus subsystem 1590 provides a mechanism for letting the various components and subsystems of computer 1520 communicate with each other as intended. Although bus subsystem 1590 is shown schematically as a single bus, alternative embodiments of the bus subsystem may utilize multiple busses.

FIG. 15 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Figure 16:
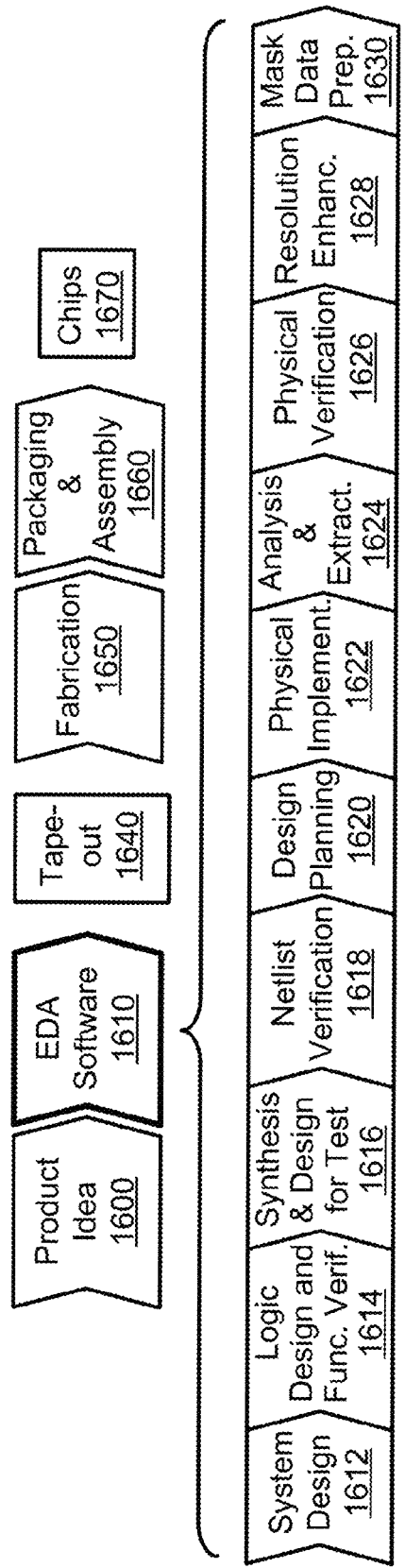
FIG. 16 depicts simplified exemplary steps in the design and fabrication of an integrated circuit that may use embodiments of the present invention.

FIG. 16 depicts simplified exemplary steps in the design and fabrication of an integrated circuit that may use embodiments of the present invention. The process starts with a product idea 1600, which is realized using Electronic Design Automation (EDA) software 1610. Chips 1670 can be produced from the finalized design by performing fabrication 1650 and packaging and assembly 1660 steps. An exemplary design flow that uses EDA software 1610 is described below for illustration purposes only. For example, an actual integrated circuit design may require a designer to perform the design flow steps in a different sequence than the sequence described below.

In the system design 1612, a designer describes the functionality to be implemented. The designer can also perform what-if planning to refine the functionality and to check costs. Further, hardware-software architecture partitioning can occur at this step. In the design and functional verification 1614, a Hardware Description Language (HDL) design may be created and checked for functional accuracy.

In the synthesis and design 1616, the HDL code can be translated to a netlist, which can be optimized for the target technology. Further, tests can be designed and implemented to check the finished chips. In the netlist verification 1618, the netlist can be checked for compliance with timing constraints and for correspondence with the HDL code. In the design planning 1620, an overall floor plan for the chip can be constructed and analyzed for timing and top-level routing. Next, in the physical implementation 1622, placement and routing can be performed.

In the analysis and extraction 1624, the circuit functionality can be verified at a transistor level. In the physical verification 1626, the design can be checked to correct any functional, manufacturing, electrical, or lithographic issues. In the resolution enhancement 1628, geometric manipulations can be performed on the layout to improve manufacturability of the design. Finally, in the mask data preparation 1630, the design can be taped-out 1640 for production of masks to produce finished chips. The embodiments of the present invention may be used, for example at the steps of design planning 1620 and/or physical implementation 1622.

Various embodiments of the present invention can be implemented in the form of logic in software or hardware or a combination of both. The logic may be stored in a computer readable or machine-readable storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The specification and drawings are, accordingly, to be regarded in an illustrative rather than a restrictive sense. However, it will be evident that various modifications and changes may be made thereunto without departing from the broader spirit and scope of the invention as set forth in the claims. In addition, the technique and system of the present invention is suitable for use with a wide variety of EDA tools and methodologies for designing, testing, and/or manufacturing integrated circuits or other electronic devices. The scope of the invention should, therefore, be determined not with reference to the above description, but instead should be determined with reference to the pending claims along with their full scope or equivalents.

What is claimed is:

1. A computer implemented method for designing an integrated circuit (IC), the computer implemented method comprising:
   dividing, using the computer, a wire disposed in the IC into a plurality of segments, each of the plurality of segments having a length extending from a first end point to a second end point;
   for each of at least a subset of the plurality of segments, forming, using the computer, an associated wide segment that does not overlap any adjacent objects; and
   replacing, using the computer, each of the at least the subset of the plurality of segments with the associated wide segment to form a widened wire, wherein forming a wide segment comprises:
   expanding the segment to form an expanded segment that includes the first and the second end points and has a size such that the expanded segment overlaps with at least one adjacent object;
   identifying adjacent objects that overlap with the expanded segment;
   for each of the identified object, forming an expanded object, the expanded object having a shape and size to enclose the identified object with additional spacing around the perimeter of the object; and
   reducing the size of the expanded segment to form the wide segment that does not overlap any of the expanded objects.

2. The method of claim 1, wherein the length of each of the plurality of segments is equal to a preset minimum length.

3. The method of claim 1 further comprising:
   for each of the at least the subset of the plurality of segments, forming, using the computer, an associated wide segment having a width greater than or equal to the width of the segment.

4. The method of claim 1, wherein each of the expanded segments has an initial width equal to a preset maximum width.

5. The method of claim 1, wherein an adjacent object is identified as overlapping with the expanded segment if a distance between the adjacent object and the expanded segment is less than a preset spacing limit.

6. The method of claim 1, wherein reducing the size of the expanded segment comprises:
   determining a largest overlap size from overlaps between the expanded segment and the expanded objects; and
   reducing the size of the expanded segment by the largest overlap size to form the wide segment that does not overlap any of the adjacent expanded objects.

7. The method of claim 6, wherein determining a largest overlap size comprising:
   determining a largest length of overlapped regions in the x-direction; and determining a largest length of overlapped regions in the y-direction.

8. The method of claim 6, further comprising:
   forming a first rectangular boundary box that contains the expanded segment;
   forming a second rectangular boundary box that contains the expanded object; and
   determining a largest overlap size of overlap between the first rectangular boundary box and the second rectangular boundary box.

9. The method of claim 6 wherein determining a largest overlap size further comprising:
   rotating the expanded segment and the expanded region by 45 degrees; and
   determining a largest length of overlapped regions in the x-direction or the y-direction.

10. The method of claim 1, wherein each of the expanded segments comprises an octagon.

11. The method of claim 1, wherein each of the expanded objects comprises an octagon.

12. A computer implemented method for widening a wire in a layout that also includes a plurality of objects adjacent to the wire, the computer-implemented method comprising:
    dividing, using the computer, the wire into a plurality of segments, each segment having a length extending from a first end point to a second end point;
    for each of the plurality of segments,
    forming, using the computer, an expanded segment that overlaps with at least a region of an adjacent object, the expanded segment being an octagon having a characteristic width W such that four of eight vertices of the octagon is a distance D away from the first end point and the other four vertices is the distance D away from the second end point, with D being a fraction of W;
    identifying, using the computer, adjacent objects that overlap with the expanded segment;
    for each of the identified objects, forming, using the computer, an expanded object, the expanded object having a shape and size to enclose the identified object with additional spacing around the perimeter of the object;

determining, using the computer, a largest overlap size from overlaps between the expanded segment and the expanded object; and reducing, using the computer, the characteristic width of the expanded segment by the largest overlap size to form an associated wide segment that does not overlap any of the adjacent objects; and replacing, using the computer, each segment of the wire with the associated wide segment to form a widened wire.

13. The method of claim 12, wherein forming a wide segment based on an original segment comprises forming a new segment having a width greater than or equal to a width of the original segment.

14. The method of claim 12, wherein the expanded segment comprises an octagon having a characteristic width W such that four of eight vertices of the octagon being W/2 away from the first end point and the other four vertices being W/2 away from the second end point.

15. The method of claim 12, wherein the length of each of the plurality of segment is a preset minimum length.

16. The method of claim 12, wherein the characteristic width of the octagon is a preset maximum width.

17. The method of claim 12, further comprising combining adjacent wide segment that have the same width to form a widened wire.

18. The method of claim 12, wherein an adjacent object is identified as overlapping with the expanded the segment if a distance between the adjacent object and the expanded segment is less than a preset spacing limit.

19. The method of claim 12, wherein determining a largest overlap size comprising:

determining a largest length of overlapped regions in the x-direction; and determining a largest distance of overlap in the y-direction.

20. The method of claim 12, further comprising:

forming a first rectangular boundary box that contains the expanded segment;

forming a second rectangular boundary box that contains the expanded object; and determining a largest overlap size of overlap between the first rectangular boundary box and the second rectangular boundary box.

21. The method of claim 12, wherein determining a largest overlap size further comprising rotating the expanded segment and the expanded region by 45 degrees.

22. A computer system for performing wire widening in integrated circuit layout the computer system configured to:

divide the wire into a plurality of segments, when the computer system is invoked to receive data representative of the integrated circuit layout, each of the plurality of segments having a length extending from a first end point to a second end point;

for each of at least a subset of the plurality of segments, form an associated wide segment that does not overlap any adjacent objects;

replace each of the at least the subset of the plurality of segments of the wire with the associated wide segment to form a widened wire;

form an expanded segment that includes the first and the second points and has a characteristic width such that the expanded segment overlaps with at least a region of an adjacent object;

identify regions in the adjacent objects that overlap with the expanded segment;

for each of the identified regions, form an expanded region, using one or more of the computer processors, the expanded region having a shape and size to enclose the identified region with a spacing around the perimeter of the region;

determine a largest overlap size from overlaps between the expanded segment and the expanded regions; and reduce the characteristic width of the expanded segment by the largest overlap size such that the expanded segment does not overlap any of the adjacent expanded regions, resulting in a wide segment that does not overlap any adjacent object.

23. A non-transitory computer-readable storage medium comprising instructions which when executed by a computer cause the computer to:

divide the wire into a plurality of segments, each of the plurality of segments having a length extending from a first end point to a second end point;

for each of at least a subset of the plurality of segments, form an associated wide segment that does not overlap any adjacent objects;

replace each of the at least the subset of the plurality of segments of the wire with a corresponding wide segment to form a widened wire;

form an expanded segment that includes the first and the second points and has a characteristic width such that the expanded segment overlaps with at least a region of an adjacent object;

identify regions in the adjacent objects that overlap with the expanded segment;

for each of the identified regions, form an expanded region, the expanded region having a shape and size to enclose the identified region with a spacing around the perimeter of the region;

determine a largest overlap size from overlaps between the expanded segment and the expanded regions; and reduce the characteristic width of the expanded segment by the largest overlap size such that the expanded segment does not overlap any of the adjacent expanded regions, resulting in a wide segment that does not overlap any adjacent object.

* * * * *